US011598804B2

(12) United States Patent
Armagost et al.

(10) Patent No.: US 11,598,804 B2
(45) Date of Patent: Mar. 7, 2023

(54) DEBUG TOOL FOR TEST INSTRUMENTS COUPLED TO A DEVICE UNDER TEST

(71) Applicant: Intel Corporation, Santa Clara, CA (US)

(72) Inventors: Jesse Armagost, Portland, OR (US); Nathan Blackwell, Hillsboro, OR (US); Matthew Boelter, Hillsboro, OR (US); Geoffrey Kelly, Hillsboro, OR (US); James Neeb, Gilbert, AZ (US); Sundar Pathy, Chandler, AZ (US); Yu Zhang, Chandler, AZ (US); Shelby Rollins, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 837 days.

(21) Appl. No.: 16/361,816

(22) Filed: Mar. 22, 2019

(65) Prior Publication Data

US 2020/0300912 A1 Sep. 24, 2020

(51) Int. Cl.
*G01R 31/28* (2006.01)
*G01R 31/317* (2006.01)
*G01R 31/319* (2006.01)

(52) U.S. Cl.
CPC . *G01R 31/31705* (2013.01); *G01R 31/31905* (2013.01)

(58) Field of Classification Search
USPC ............... 714/30, 722, 724, 726; 716/136
See application file for complete search history.

(56) References Cited

U.S. PATENT DOCUMENTS

| | | | |
|---|---|---|---|
| 2016/0062865 A1* | 3/2016 | Tule | G06F 11/321 714/30 |
| 2016/0373816 A1* | 12/2016 | Kashikar | H04N 21/43635 |
| 2018/0017608 A1* | 1/2018 | Nithyanandan | H04B 17/0085 |
| 2018/0337738 A1* | 11/2018 | Wen | H04B 17/309 |
| 2019/0025372 A1* | 1/2019 | Waelchli | G11C 29/56016 |
| 2019/0235713 A1* | 8/2019 | Borenstein | G06F 3/0484 |
| 2019/0391202 A1* | 12/2019 | Chang | G01R 31/2813 |
| 2020/0073866 A1* | 3/2020 | Joyner | G06F 16/156 |

FOREIGN PATENT DOCUMENTS

AU 2015200668 B2 * 12/2016 ............ F41A 17/063

* cited by examiner

*Primary Examiner* — Brian Ngo
(74) *Attorney, Agent, or Firm* — Schwabe, Williamson & Wyatt, P.C.

(57) ABSTRACT

Embodiments described herein may be directed to receiving a plurality of data captured, respectively, by a plurality of test instruments coupled to a device under test, wherein a plurality of data elements within, respectively, the plurality of captured data are associated with a timestamp based upon a time a data element was captured. Embodiments may also analyze the received plurality of data captured, respectively, by the one or more test instruments, and graphically display at least a portion of the analyzed plurality of captured data to a user. Other embodiments may be identified herein.

22 Claims, 10 Drawing Sheets

DEBUG TOOL FOR TEST INSTRUMENTS COUPLED TO A DEVICE UNDER TEST

FIELD

Embodiments of the present disclosure generally relate to the field of package assemblies, and in particular operational testing of package assemblies.

BACKGROUND

Continued reduction in end product size of mobile electronic devices such as smart phones and ultrabooks is a driving force for the increasing functionality and the reduced size of package assemblies while maintaining quality products.

DETAILED DESCRIPTION

Embodiments of the present disclosure may generally relate to systems, apparatus, techniques and/or processes directed to a debug tool within an ATE for use with a plurality of test instruments that are testing a device under test (DUT). Embodiments described herein may be directed to receiving a plurality of data captured, respectively, by a plurality of test instruments coupled to a device under test, wherein a plurality of data elements within, respectively, the plurality of captured data are associated with a timestamp based upon a time a data element was captured. Embodiments may also analyze the received plurality of data captured, respectively, by the one or more test instruments, and display at least a portion of the analyzed plurality of captured data to a user.

In addition, embodiments of a debug tool described herein may also receive an indication of a test configuration from a user, where the test configuration is associated with configurations, respectively, of each of the one or more of the plurality of test instruments to identify attributes of data to be captured from the each of the one or more of the plurality of test instruments. Embodiments may also determine, based upon the received indication of the test configuration, one or more test instrument configuration commands to transmit, respectively, to the one or more of the plurality of test instruments based upon the indicated test configuration. Embodiments may also transmit the determined one or more instrument configuration commands, respectively, to the one or more of the plurality of test instruments.

An ATE may be used by a user to test and/or debug a DUT where there may be multiple interactions causing various performance issues or performance characteristics exhibited during testing to be identified and understood. These issues may include interactions between the silicon and circuitry, test programs, test patterns, the test interface unit (TIU), or the test equipment itself. In legacy implementations, the DUT itself and hardware used for testing have traditionally been seen as black boxes to the user while debugging one of these test environment entities. However, for example, information that includes real-time visibility of tester power supply and DUT voltage/current/thermal behavior during test execution provides useful information into what is happening inside the DUT elements under test, especially for identifying and debugging transient events like current spikes. For example, frequently, multiple power supply rails may be related to each other through the DUT in unanticipated ways.

In embodiments, the debug tool may rely on real-time debugging information and measurement data readily provided by the respective test instruments, be synchronized in time, not require modifying test content (such as the test patterns, voltage level conditions, or test program code), and importantly should not disturb the behavior of the testing system while collecting data, to preserve the integrity of the test the DUT is undergoing. The debug tool may use continuous data streams from the various test equipment during the complete test flow process, as well as support high resolution plots of activity, for example, via graphical displays, during specific periods of testing execution or during specific testing events. In embodiments, implementations may seamlessly blend all device power supply (DPS) and thermal measurement systems into one graphical user interface.

Legacy implementations within an ATE require designing and implementing custom test program code to capture data for debug analysis, which overrides the test program's native code which may be capturing measurements for the purpose of test, leaving a conflict between the debug tool and test program. As a result, these legacy implementations may require significant test program edits each time a single issue within the DUT is being debugged. Often, the tester user may not have the skills to write this code, which may result in an incorrect test program execution flow which may then alter the behavior of the DUT and may obscure the very issue being debugged. In addition, designing and implementing custom test program code may not be possible in all scenarios due to conflicts between the test program settings and the debug tool requirements. An example is a test program is designed to take an average of 10 samples with a specific sampling interval, and the debug tool needs a continuous stream at a different sampling interval. In embodiments described herein, the ATE may include test instruments designed to execute test measurements on a DUT and report continuous measurements to the debug tool at the same time.

Other legacy implementations within an ATE may include soldering leads to the TIU for scope probes. These legacy implementations may require modifying the TIU or DUT socket which may be too risky to change, or these legacy implementations may use production hardware (TIU, DUT socket) that is not allowed to be modified. In addition, this legacy approach only works for voltages, not current and temperature, and is limited to the points that are accessible on the surface of the TIU printed circuit board (PCB). Thus, it may not be possible to route scope probes to external instruments in many cases since the DUT handling equipment may make access to the TIU area impossible due to the TIU being completely covered by the tester on one side, and the handler on the other side.

Other legacy implementations may include integrating off the shelf measurement tools, for example oscilloscopes, into the ATE. For example, ATE testers may embed an oscilloscope into the test system as an instrument and attempt to matrix its inputs into various test instruments. These implementations are primarily limited to voltage sense in a few locations due to the limited access and small number of channels available on the oscilloscope. As a result, this approach may not integrate well into the tester hardware (HW) or software (SW) environments within the tester.

Embodiments described herein may include operations that include ATE instruments that are designed to continuously take measurements at a full resolution and stream the resulting measurement data. As a result, test program measurement requests to the ATE instruments do not interfere with their operation and do not interrupt resulting measurement streams. Instead, in embodiments, the debug tool accepts multiple measurement streams data from each of the ATE instruments.

In addition, embodiments that include the tester architecture itself support continuously streaming the individual instrument data streams to a central collection point, or database, for access by the debug tool. In embodiments, each stream may be isochronous and all data streams can be retrieved in synchronization with each other.

Embodiments of the debug tool also includes hardware and/or software support for a graphical user interface (GUI) to display plots various data streams to a user. Embodiments also provide support for backend software or modules to allow easy selection of which data streams to present to the user, as well as to provide the user with many choices of triggering data capture and display. As a result, embodiments described herein may allow the user to quickly answer questions about what is going on inside the ATE equipment and the DUT to understand the root cause of a performance issues.

For example, in debugging a current clamp event, where the DUT current demand exceeds a user defined limit, the user can quickly trigger on an alarm of interest and display in high resolution to the user the current and voltage synchronized with each other. As a result, the user is able to easily tell if there is a problem with test program power-on settings, TIU design, or background DUT current. In another example, when trying to optimize Icc tests, where the DUT's current demand is tested, the user can readily plot the DUT current during pattern execution and understand from the plot where the best place is to insert measurement triggers as well as how large of a sample window for averaging is needed.

In embodiments, incorporating HDMT test equipment in an ATE gives users the ability to debug test program, TIU design, and silicon problems much more quickly. It also allows, for example, users to probe current and voltages inside the system instantly even while the users are halfway around the world operating the ATE remotely. In most cases, a single debug session that, in legacy implementations, would typically take a day or two to set up the code and/or measurement connections on TIU can be done using embodiments described herein in minutes, and with much better utility because multiple data types (current, voltage, and temperature) can be obtained at once and synchronously.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Figure 1:
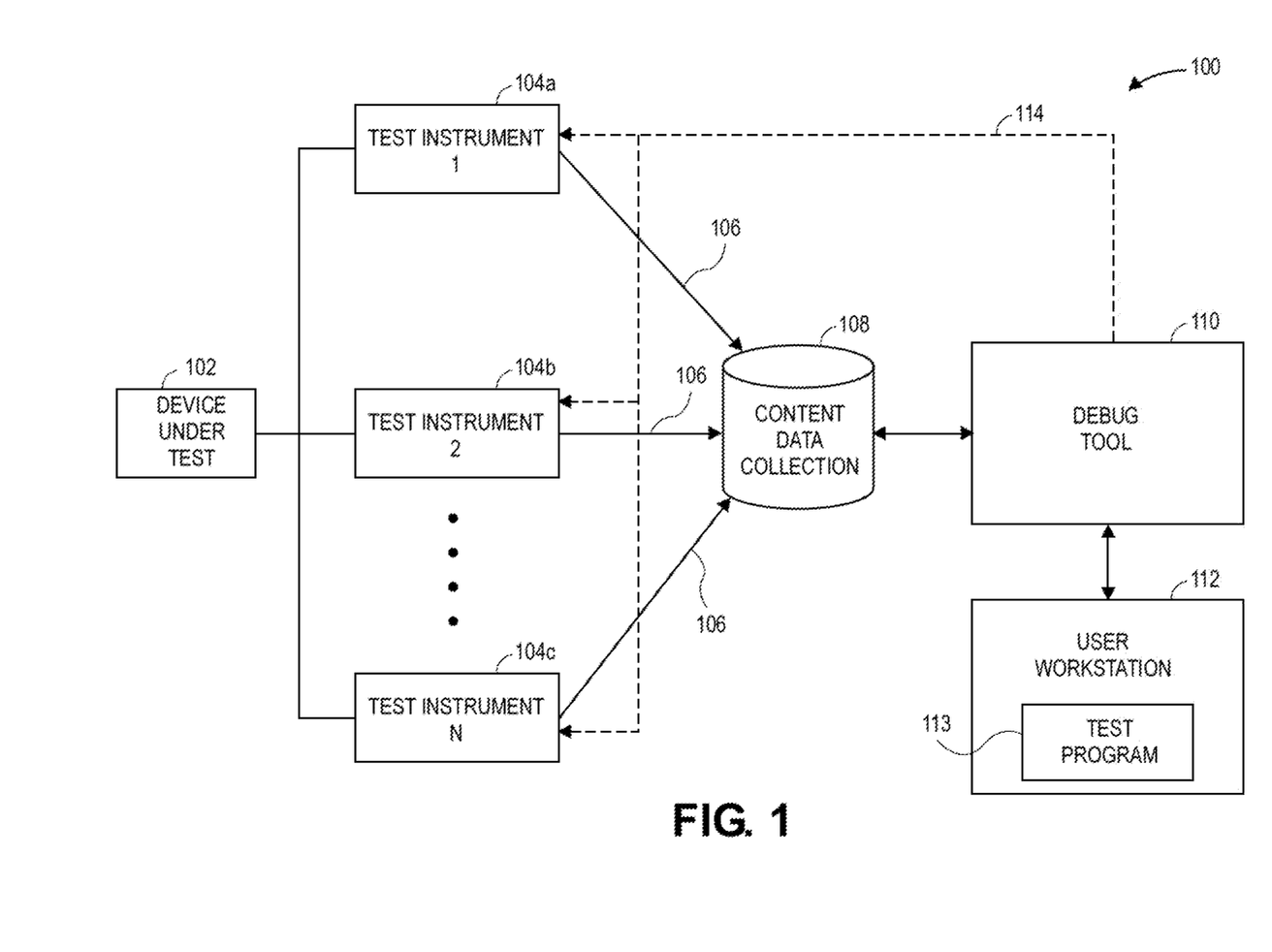
FIG. 1 is a context diagram of automated test equipment (ATE) that includes a debug tool, in accordance with embodiments.

FIG. 1 is a context diagram of an ATE that includes a debug tool, in accordance with embodiments. Diagram 100 shows a portion of an ATE that includes various test instruments 104a-104c connected to a DUT 102 that may be in various states of operation. At least some of the test instruments 104a-104c may be ATE instruments that are designed to take test measurements of various aspects of the DUT 102. In embodiments, these test measurements may continuously be made by the test instruments 104a-104c for the debug tool, whether the instrument is actively being used or not at the time by the test program. This differs from legacy ATE test instruments (not shown) that take measurements only when requested by a test program, which limits an ability to collect continuous data independently of test program execution.

Measurement data captured by ATE test instruments may be stored in memory (not shown) included within the various ATE test instruments 104a-104c for test program and debug tool use. In embodiments, test instrument memory (not shown) may be transient memory that is continuously overwritten. The various test instruments 104a-104c may also include reserved memory space designated for data consisting of high speed sequential measurements that may be used for posttest plotting.

In embodiments, the measurement data may be continuously streamed via data connections 106 to a central data collection database 108. In other embodiments, the data connections 106 may route the data stream from the various test instruments 104a-104c directly to the debug tool 110 and bypass the central data collection database 108. In other embodiments, the continuous data stream may be sent to other test instruments 104a-104c by other data links (not shown). For example, each test instrument 104a-104c can do a peer to peer data transfer directly to another instrument 104a-104c, or to a dedicated space in controller dynamic random access memory (DRAM) (not shown) without operating system intervention to allow continuous background data movement without impacting test program performance. In embodiments, this data may be subsequently accessed by the debug tool 110. In embodiments, the test program 113 may reside in and may be executed from the workstation 112.

Examples of measurement data collected by the test instruments 104a-104c that are coupled to the DUT 102 include thermal data, voltage data, and current data from various areas of the DUT 102. The measurement data may be streamed from one of the respective test instruments 104a-104c in an isochronous manner. In addition, all or part of the measurement data elements within the measurement data may include a timestamp. In this way, various streams of measurement data may be temporally aligned for later viewing.

The test instruments 104a-104c may collect the measurement data at varying time intervals. For example, a test instrument 104a may be put into a high-resolution mode to capture measurement data at a high rate. In embodiments, this high resolution measurement data may be initially stored locally in the test instrument 104a memory (not shown). A high-resolution mode may be used to examine measurement data related to high-speed transient events in either the test instrument 104a or the DUT 102. The examination of measurement data may include, for example, subsequently analyzing phase relationships between voltage and current. Other examples are discussed below with respect to FIGS. 2-6.

In embodiments, the debug tool 110 receives measurement data from the test instruments 104a-104c directly from the data connections 106 or from the central data collection database 108. In embodiments, the debug tool 110 may analyze the received measurement data, and subsequently display the analyzed data on a user workstation 112.

A user may use the user workstation 112 to configure a selection of the type of measurement data to view, as well as to specify events and/or triggers to identify during test. The debug tool 110 may subsequently send commands or indications of the desired configuration and to the test instruments 104a-104c via configuration data channel 114. In embodiments, the configuration data channel 114 may be a wired or wireless data connection and may connect directly to a test instrument 104a, or may be coupled to multiple test instruments 104a-104c via a daisy chain topology (not shown).

In embodiments, the debug tool 110 may have at least two modes for presenting measurement data to a user. The first mode is a continuous streaming mode where the measurement data from the test instrument streams to the debug tool 110 for immediate and continuous display on the user workstation 112. This may function similar to the auto trigger mode of an oscilloscope. This mode may continually stream measurement data from multiple test instruments at the same time. Measurement data in this mode may appear at a lower resolution on the user workstation 112 display to facilitate viewing large sections of test flow to look for oddities or events across many tests or across a whole test flow.

The second mode is a snapshot mode, which may be similar to a one-shot trigger of an oscilloscope, where a user using the debug tool 110, can configure the testing instruments 104a-104c to trigger a high resolution sample window based on an event such as a test, alarm, or test condition event. This mode configures the corresponding test instrument hardware to store the high speed data in the test instruments local memory. The test flow (i.e. the test program 113 test sequence) of interest is then executed and, if the trigger is positive, the data is collected by the debug tool 110 and then displayed on the user workstation 112 display after the sampling is completed. The resolution in this mode can be the full sample rate of the measurement data because the data is stored locally in the test instrument, for example in DRAM. This mode is used to look at high speed transient events in the test instrument 104a-104c or DUT 102, and the phase relationship between voltage and current can be seen.

The debug tool may support a GUI interface on the user workstation 112 display to configure the selection of types of data to view, as well as triggers to collect the right window in time and then display the data in plot form. Examples of this GUI interface that includes data viewing selections are found in FIGS. 2-6.

In embodiments, the debug tool 110 may receive an indication of a test configuration from the user via the user workstation 112. A test configuration is associated with various configurations, respectively, of the test instruments 104a-104c to identify attributes or characteristics of data to be captured from the each of the test instruments. The debug tool 110 may then determine one or more test instrument configuration commands to transmit to the test instruments 104a-104c, and then transmit those configuration commands. For example, a user may indicate through the user workstation 112 that upon a particular event trigger, a test instrument should record a higher measurement sample rate to be sent down data connections 106 for access by the debug tool 110.

In embodiments, the debug tool 110 may also send commands, based upon user input, to release data that may be stored in the local memory (not shown) of the test instruments 104a-104c to be sent to the debug tool 110. The debug tool 110 may include other software components, which may run as background processes, to interface with the test instrument 104a-104c hardware or software for configuration, to retrieve the high speed snapshot data, and to manage the data cache from the streamed data. In embodiments, data cache management within the test instruments 104a-104c is critical as measurement data is continuously streaming to the DRAM memory, which may also be referred to as a data block. In embodiments, this information may continuously be accessed by the debug tool 110 GUI for retrieval, analysis, and display of data on user workstation 112. The data block is finite, so extracting test data from the test instruments 104a-104c must be done to manage overflow/underflow from the data blocks.

In embodiments, the debug tool 110, the user workstation 112 and/or the central data collection database 108 may be individual components or may be combined within a single system. The data connections between the user workstation 112, debug tool 110, and central data collection database 108, as well as data connections 106 and configuration data channel 114 may be high-speed data connections, including bus connections, to facilitate the rapid movement of measurement data among various components of the ATE 100. These data connections may be wired, fiber-optic, wireless, or other suitable data communication path.

Figure 2:
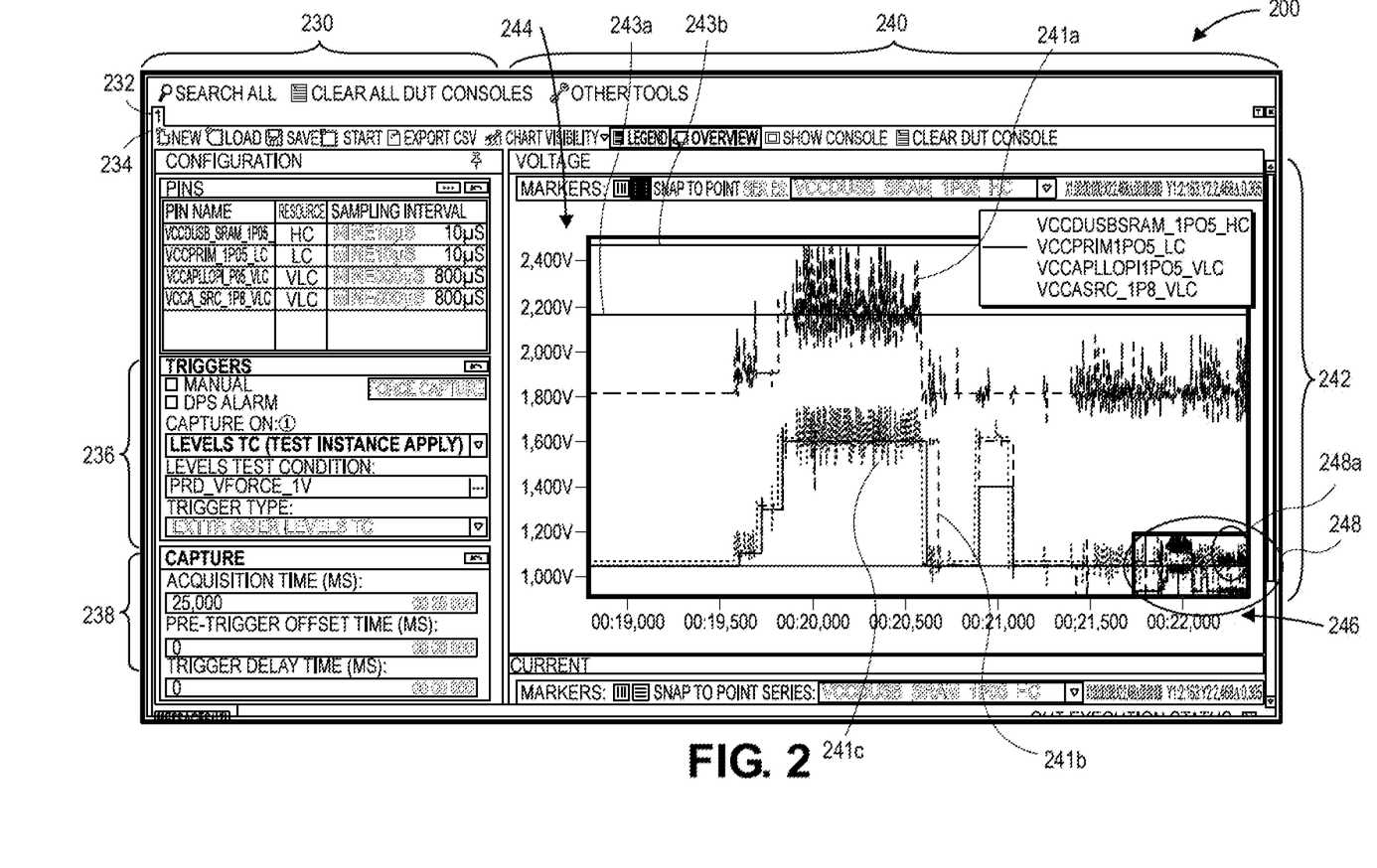
FIGS. 2-6 illustrate example user interfaces for a debug tool, in accordance with embodiments.

FIGS. 2-6 illustrate example user interfaces for a debug tool, in accordance with embodiments. The GUI tool (examples below) is used, for example, to configure the selection of types of data to view, to configure triggers to collect the right window in time, and to display the data in plot form to the user for analysis. FIG. 2 includes diagram 200 that shows an example screenshot of a GUI interface that shows measurement data received from test instruments 104a-104c. The left side of the GUI interface 230 may include a configuration section 232 that includes various information about the testing environment and the measurement data collected. For example, the configuration section 232 may include a pins section 234 that identifies a pin name, a resource, for example high current HC, low current LC, or very low current VLC, and a sampling interval.

The left side of the GUI interface 230 may also include a triggers section 236 to allow a user to identify various triggers including manual or DPS alarm triggers, and to set attributes for capturing data and/or trigger type. A capture section 238 allows the user to identify and view capture information, for example acquisition time, pre-trigger offset time, or trigger delay time. In embodiments, the user may add, remove, or alter values indicated on the left side of the GUI interface 232 two cause different measurement data values to display on the display area 242.

The right side of the GUI interface 240 includes a display area 242 were measurement data from various test instruments 104a-104c may be displayed. The y-axis 244 may be associated with a unit of measure such as temperature, voltage, or amperage. In embodiments, there may be multiple y-axes (not shown) where each may correspond to a different unit of measure or a different scale. The x-axis 246 may represent units of time. In this way, measurement data from various test instruments 104a-104c may be readily compared along a common timeline to visually identify various performance attributes of the DUT 102.

In addition, overview window 248 provides a graphical view of measurement data that includes time ranges outside of the time ranges shown in the display area 242. In embodiments, a highlighted section 248a within the overview window 248 graphically shows the time range shown in the display area 242 in the context of the overview window 248 time range. In embodiments, the overview window 248 time range may be adjusted using the user interface on the left side of the GUI interface 230. In embodiments, as shown below with respect to FIGS. 5-6, the display area 242 may include multiple display areas.

Display area 242 shows the voltage details of 3 power rails 241a, 241b, 241c of a DUT 102 over the course of a test. As shown the display area 242 includes cursor lines 243a, 243b to measure 300 mV of overshoot above nominal.

Figure 3:
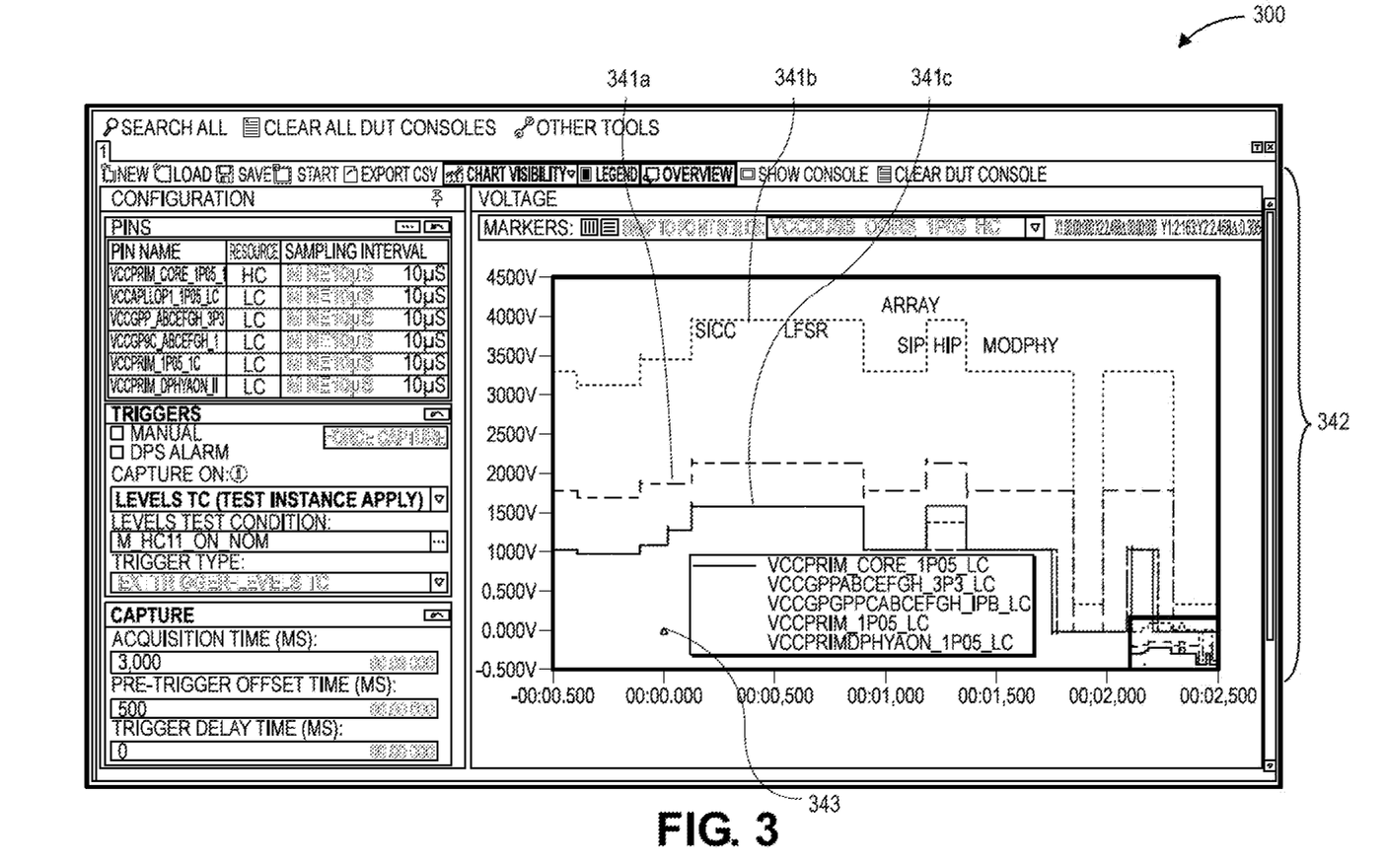
Figure 4:
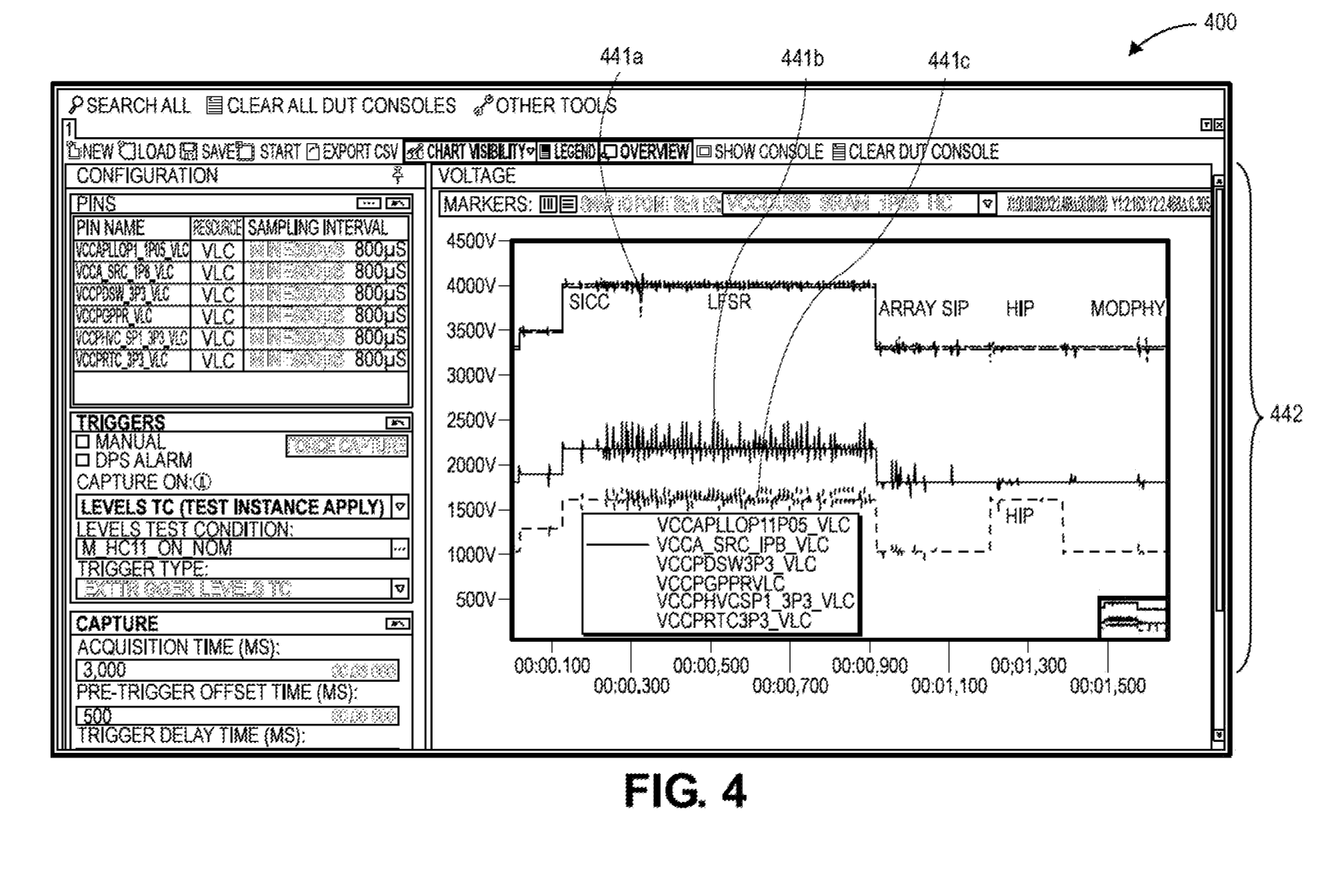

FIGS. 3-4 show examples of comparisons of measurements taken from a DUT 102 over the course of a test. FIG. 3 includes diagram 300 which shows that the LC power supply types 341a, 341b, 341c within display area 342 are relatively smooth and clean. In contrast, FIG. 4 includes diagram 400 that shows that the VLC types 441a, 441b, 441c show a significant over/undershoot from di/dt (i.e. load transients). The measurement data shown in FIGS. 3-4 were taken over a portion of a test program flow. Note: test names are overlaid to demonstrate test content vs. DUT power activity. The display area 342 may include various markers, such as marker 343, shown as a triangle, placed by the user along a timeline to reference a point in the test program flow.

Figure 5:
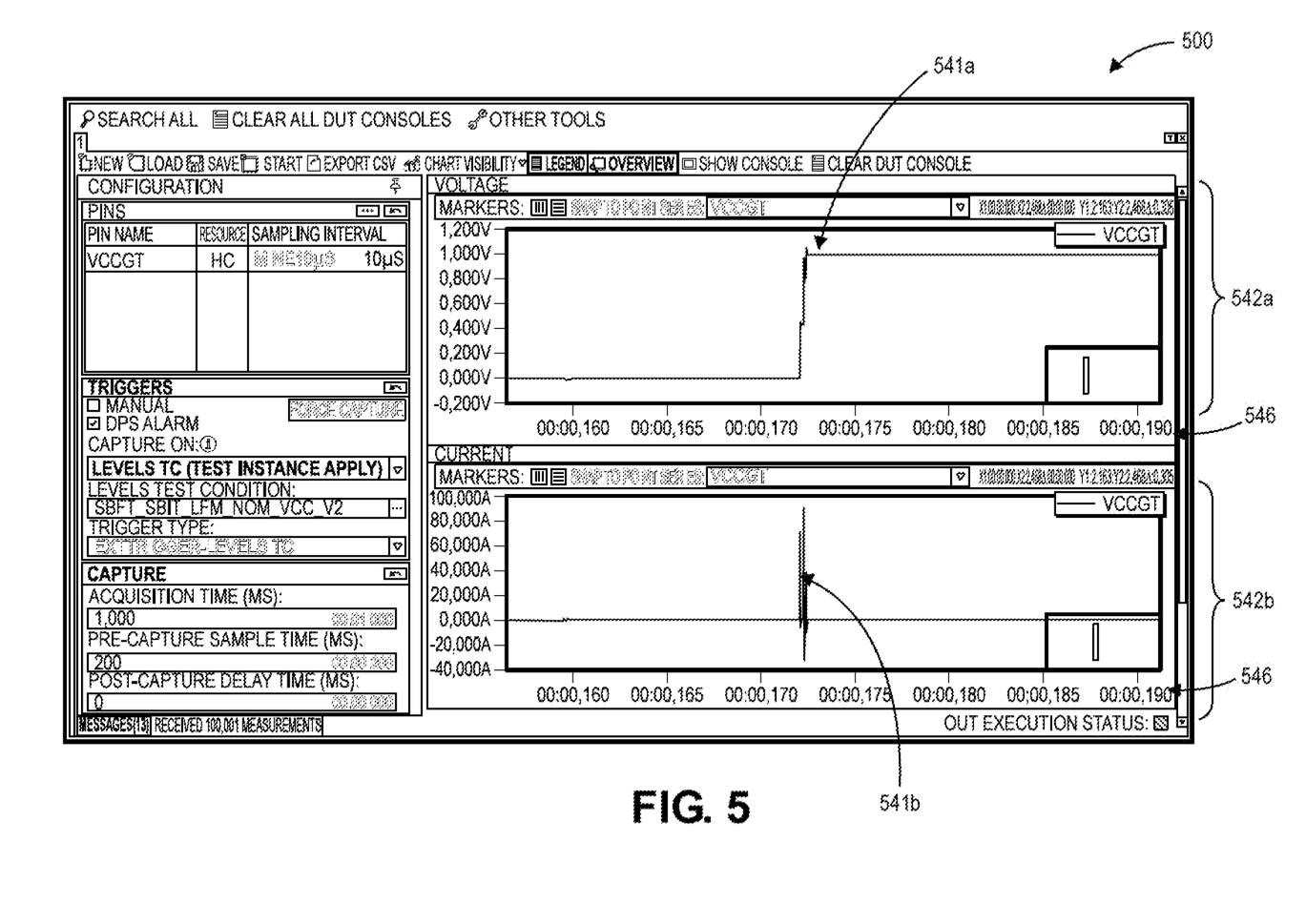
Figure 6:
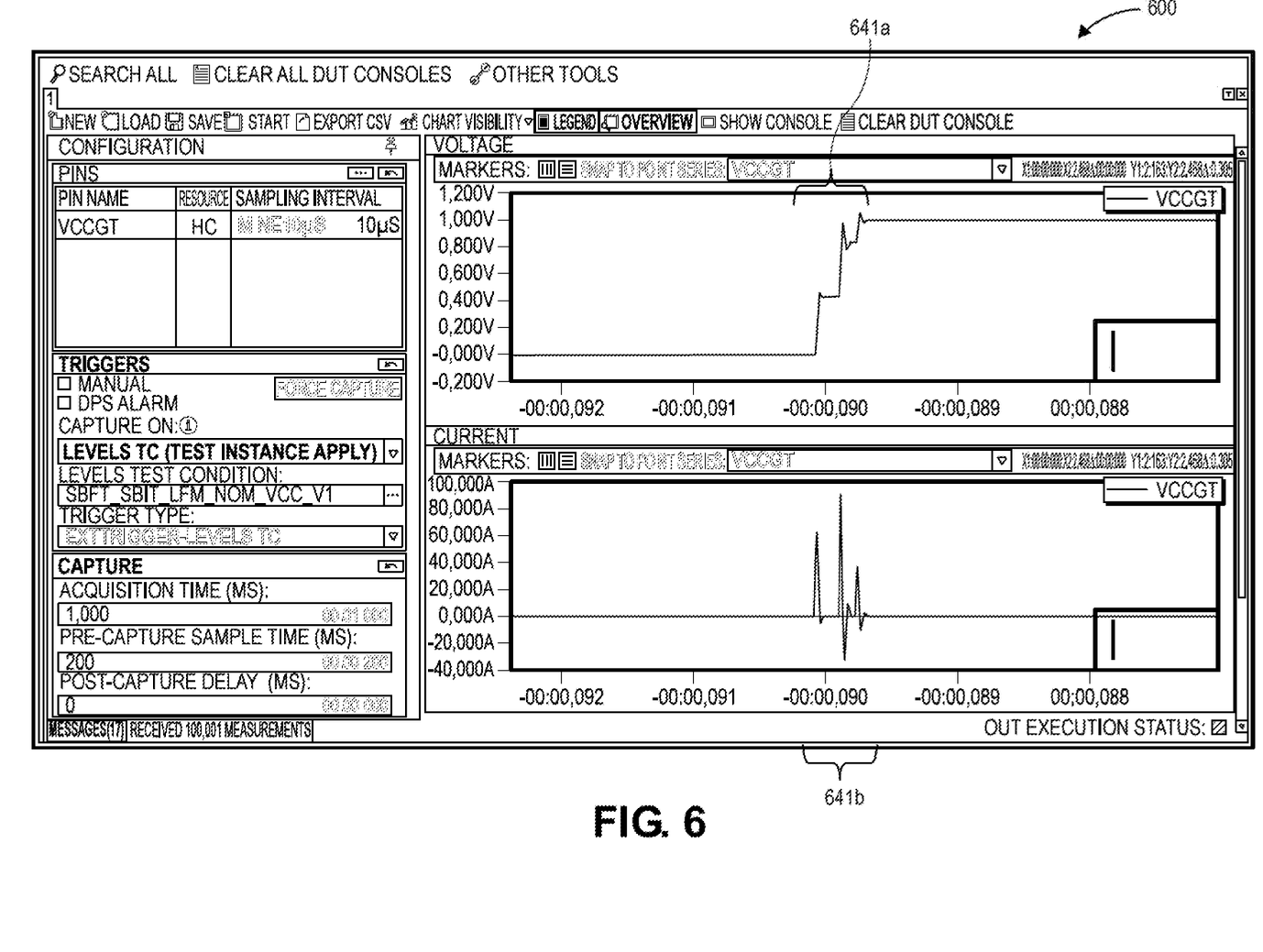

FIGS. 5-6 show examples of different time interval snapshots of a power supply as a DUT under test. FIG. 5 includes diagram 500 that shows a snapshot of measurements of a power supply turning on. A first display area 542a shows a voltage pattern 541a and a second display area 542b shows a current pattern 541b. The snapshot of the measurement data are aligned on a common timeline 546 so a user can see the time relationship between the current and voltage. FIG. 6 includes diagram 600 that shows the same measurement data only zoomed in at a higher resolution where the detailed shape of each individual voltage step 641a and the resulting current transient 641b can be readily viewed by a user.

Figure 7:
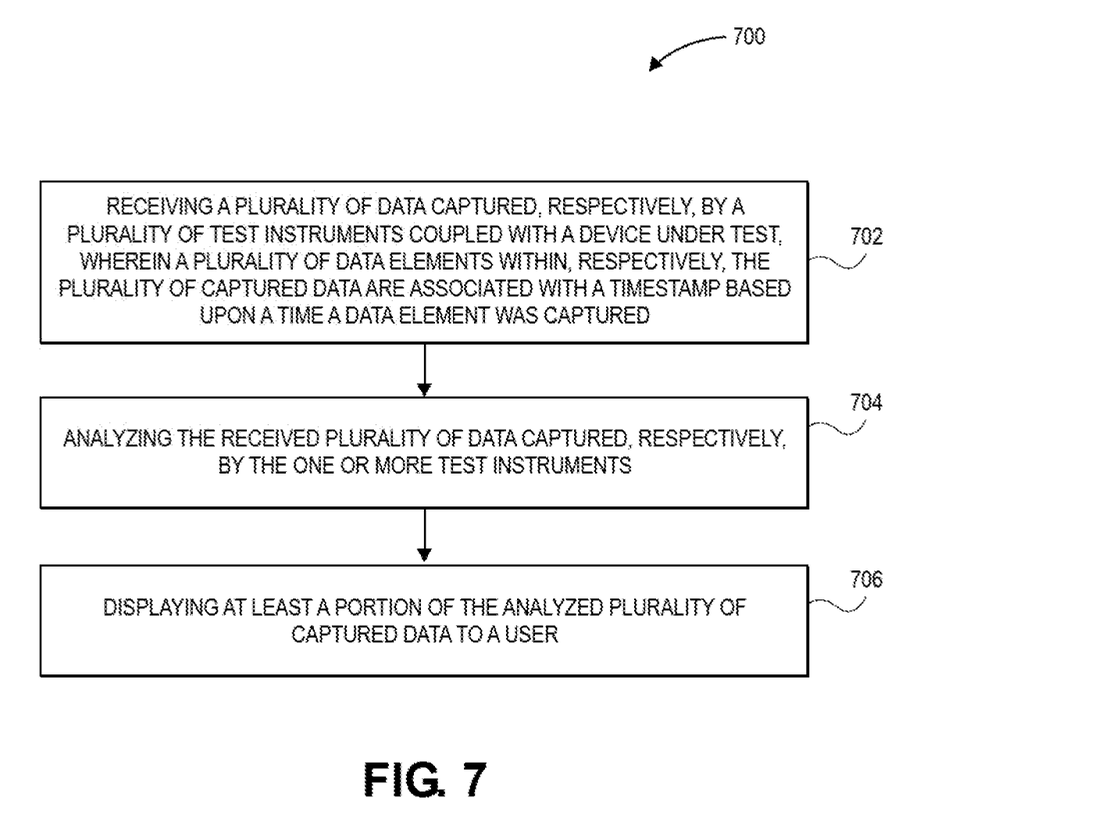
FIG. 7 illustrates an example of a process to implement a debug tool, in accordance with embodiments.

FIG. 7 illustrates an example of a process to implement a debug tool, in accordance with embodiments. Process 700 may be performed by one or more elements, techniques, or systems that may be found in FIGS. 1-6 and 8-10. In particular, all or part of the process 700 may be performed by the debug tool 110 of FIG. 1.

At block 702, the process may include receiving a plurality of data captured, respectively, by a plurality of test instruments coupled with a DUT, wherein a plurality of data elements within, respectively, the plurality of captured data are associated with a timestamp based upon a time a data element was captured. In embodiments, the plurality of test instruments may be similar to test instruments 104a-104c of FIG. 1 that are coupled to the DUT, which may be similar to DUT 102. The test instruments 104a-104c may be ATE instruments. In embodiments, as these test instruments 104a-104c capture measurement data from the DUT 102 while under test, each captured data element may be associated with a timestamp based upon when the event resulting in that data element was captured.

The captured measurement data may be then sent via data connections 106 to a central data collection database 108 which may be accessed by the debug tool 110. In embodiments, the measurement data may be sent directly from the test instruments 104a-104c to the debug tool 110 bypassing the central data collection database 108.

At block 704, the process may include analyzing the received plurality of data captured, respectively, by the one or more test instruments. In embodiments, the debug tool 110 may analyze the received measurement data from test instruments 104a-104c based upon user settings received from the user workstation 112. In embodiments, the analysis may include identifying various streams of measurement data, and normalizing the data for display, for example, upon an x-axis 246 and y-axis 244 plot.

At block 706, the process may include displaying at least a portion of the analyzed plurality of captured data to a user. In embodiments, the debug tool 110 may cause the analyzed measurement data to be graphically displayed to a user on workstation 112.

In embodiments, the process may further include receiving an indication of a test configuration from the user, wherein the test configuration is associated with configurations, respectively, of each of the one or more of the plurality of test instruments to identify attributes of data to be captured from the each of the one or more of the plurality of test instruments. A user may send an indication of a test configuration using the user workstation 112 to the debug tool 110. For example, the user may wish to receive measurement data from a subset of test instruments 104a-104c, receive measurement data at a particular sample rate, or to set alerts and/or triggers within the subset of test instruments 104a-104c to cause the instruments to modify data measurements collected based upon the alerts and/or triggers. These requests may be sent to the debug tool 110 using, for example, the GUI interfaces described in FIGS. 1-6.

In embodiments, the process may further include determining, based upon the received indication of the test configuration, one or more test instrument configuration commands to transmit, respectively, to the one or more of the plurality of test instruments based upon the indicated test configuration. The debug tool 110 may then take the user preferences inputted into the user workstation 112 user interface and determine commands that are to be sent to the test instruments 104a-104c to alter the test measurement data received or other operation of the instruments.

In embodiments, the process may further include transmitting the determined one or more instrument configuration commands, respectively, to the one or more of the plurality of test instruments. The debug tool 110 may then send these commands over the configuration data connections 114.

Figure 8:
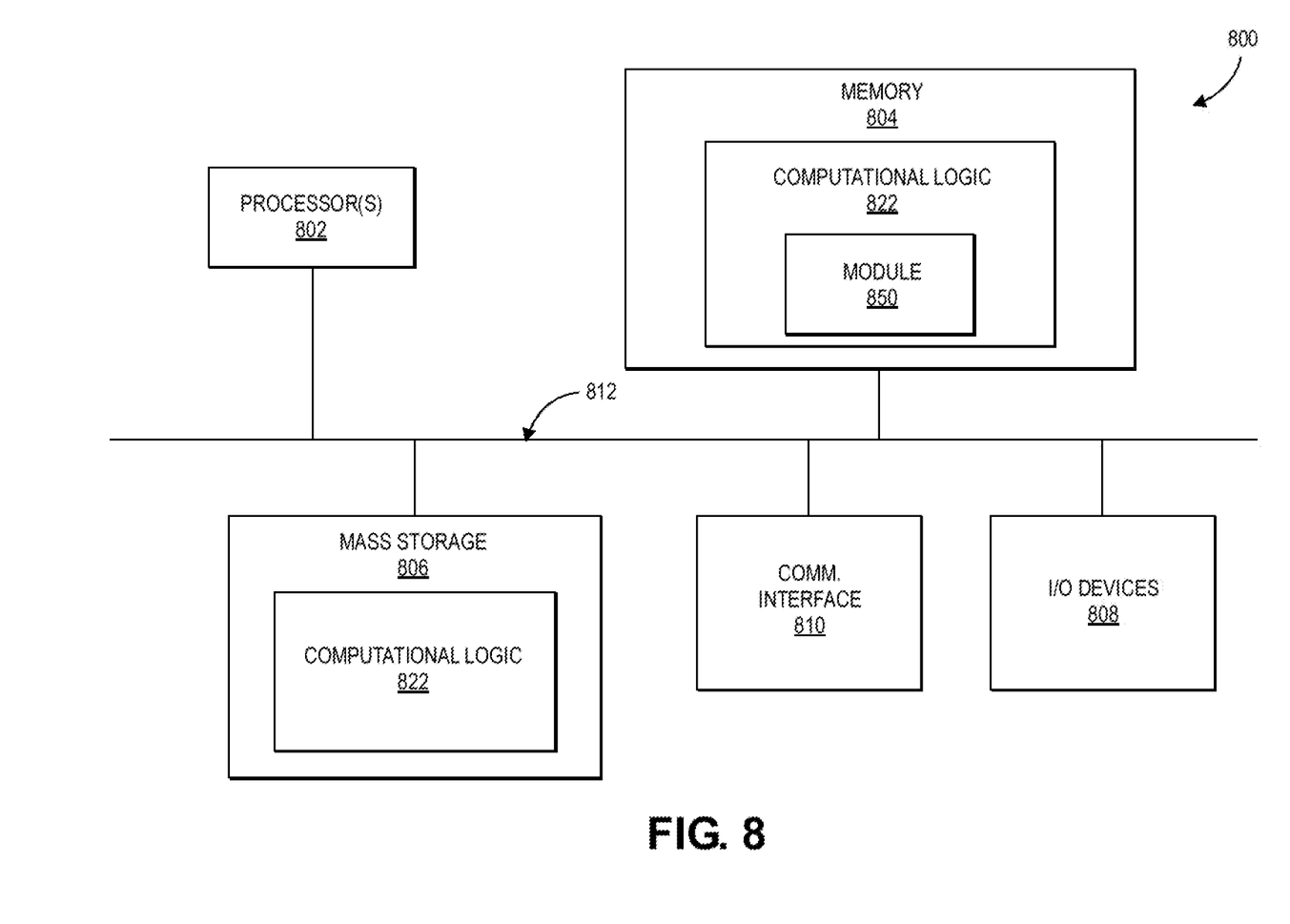
FIG. 8 illustrates an example computing system for implementing a debug tool, in accordance with embodiments.

FIG. 8 illustrates an example computing system for implementing a debug tool, in accordance with embodiments. For example, the computing device 800 may be suitable to implement the functionalities associated with FIGS. 1-7 and 8-10, including diagrams 100, 102, 104a-104c, 106, 108, 110, 114, 200, 300, 400, 500, 600, 700, and/or 1000.

As shown, computing device 800 may include one or more processors 802, each having one or more processor cores, and system memory 804. The processor 802 may include any type of unicore or multi-core processors. Each processor core may include a central processing unit (CPU), and one or more level of caches. The processor 802 may be implemented as an integrated circuit. The computing device 800 may include mass storage devices 806 (such as diskette, hard drive, volatile memory (e.g., DRAM), compact disc read only memory (CD-ROM), digital versatile disk (DVD) and so forth). In general, system memory 804 and/or mass storage devices 806 may be temporal and/or persistent storage of any type, including, but not limited to, volatile and non-volatile memory, optical, magnetic, and/or solid state mass storage, and so forth. Volatile memory may include, but not be limited to, static and/or dynamic random access memory. Non-volatile memory may include, but not be limited to, electrically erasable programmable read only memory, phase change memory, resistive memory, and so forth.

The computing device 800 may further include input/output (I/O) devices 808 such as a display, keyboard, cursor control, remote control, gaming controller, image capture device, one or more three-dimensional cameras used to capture images, and so forth, and communication interfaces 810 (such as network interface cards, modems, infrared receivers, radio receivers (e.g., Bluetooth), and so forth). I/O devices 808 may be suitable for communicative connections with three-dimensional cameras or user devices. In some embodiments, I/O devices 808 when used as user devices may include a device necessary for implementing the functionalities of receiving an image captured by a camera as described in reference to FIG. 1.

The communication interfaces 810 may include communication chips (not shown) that may be configured to operate the device 800 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 810 may operate in accordance with other wireless protocols in other embodiments.

The above-described computing device 800 elements may be coupled to each other via system bus 812, which may represent one or more buses. In the case of multiple buses, they may be bridged by one or more bus bridges (not shown). Each of these elements may perform its conventional functions known in the art. In particular, system memory 804 and mass storage devices 806 may be employed to store a working copy and a permanent copy of the programming instructions implementing the operations and functionalities associated with diagrams 100, 102, 104a-104c, 106, 108, 110, 114, 200, 300, 400, 500, 600, 700, and/or 1000, generally shown as computational logic 822. Computational logic 822 may be implemented by assembler instructions supported by processor(s) 802 or high-level languages that may be compiled into such instructions.

In embodiments, the Computational Logic 822 may contain a module 850, which may perform one or more of the functions associated with FIG. 1 diagrams 110 and 112, or with FIGS. 2-7.

A permanent copy of the programming instructions may be placed into mass storage devices 806 in the factory, or in the field, though, for example, a distribution medium (not shown), such as a compact disc (CD), or through communication interfaces 810 (from a distribution server (not shown)).

Figure 9:
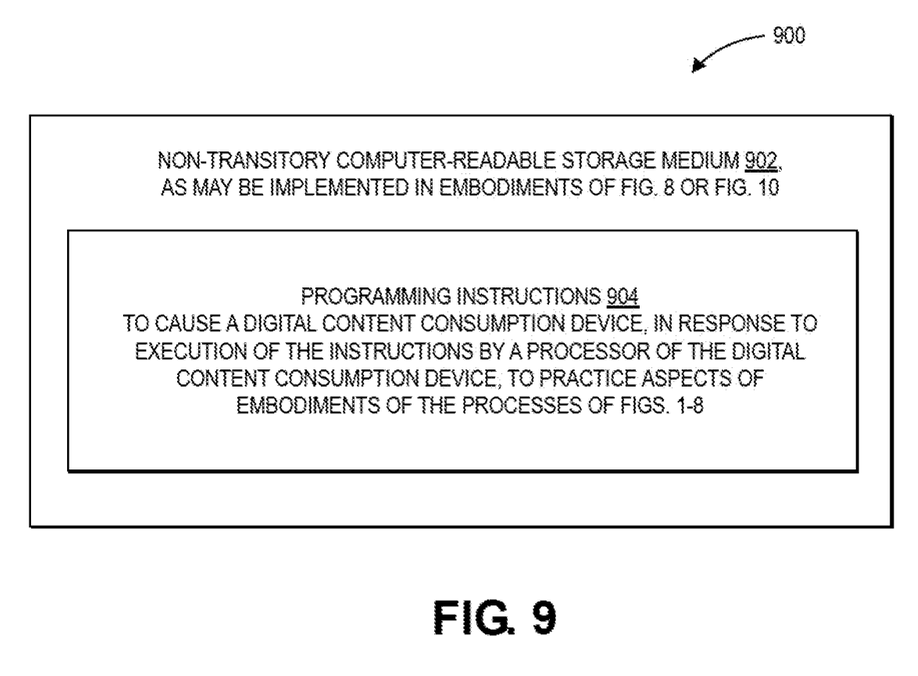
FIG. 9 is a diagram 900 illustrating computer readable media 902 having instructions for implementing a debug tool, in accordance with embodiments.

FIG. 9 is a diagram 900 illustrating computer readable media 902 having instructions for implementing a debug tool, in accordance with embodiments. As illustrated, non-transitory computer-readable storage medium 902 may include a number of programming instructions 904 (e.g., including one or more module 850 that may include one or more of a data-receive module, an analysis module, a display module, an input module, and/or a transmission module as described herein). Programming instructions 904 may be configured to enable a device, e.g., computing device 800 or 1000, in response to execution of the programming instructions, to perform one or more operations of the processes described in reference to FIGS. 1-7. In alternate embodiments, programming instructions 904 may be disposed on multiple non-transitory computer-readable storage media 902 instead. In still other embodiments, programming instructions 904 may be encoded in transitory computer-readable signals.

Figure 10:
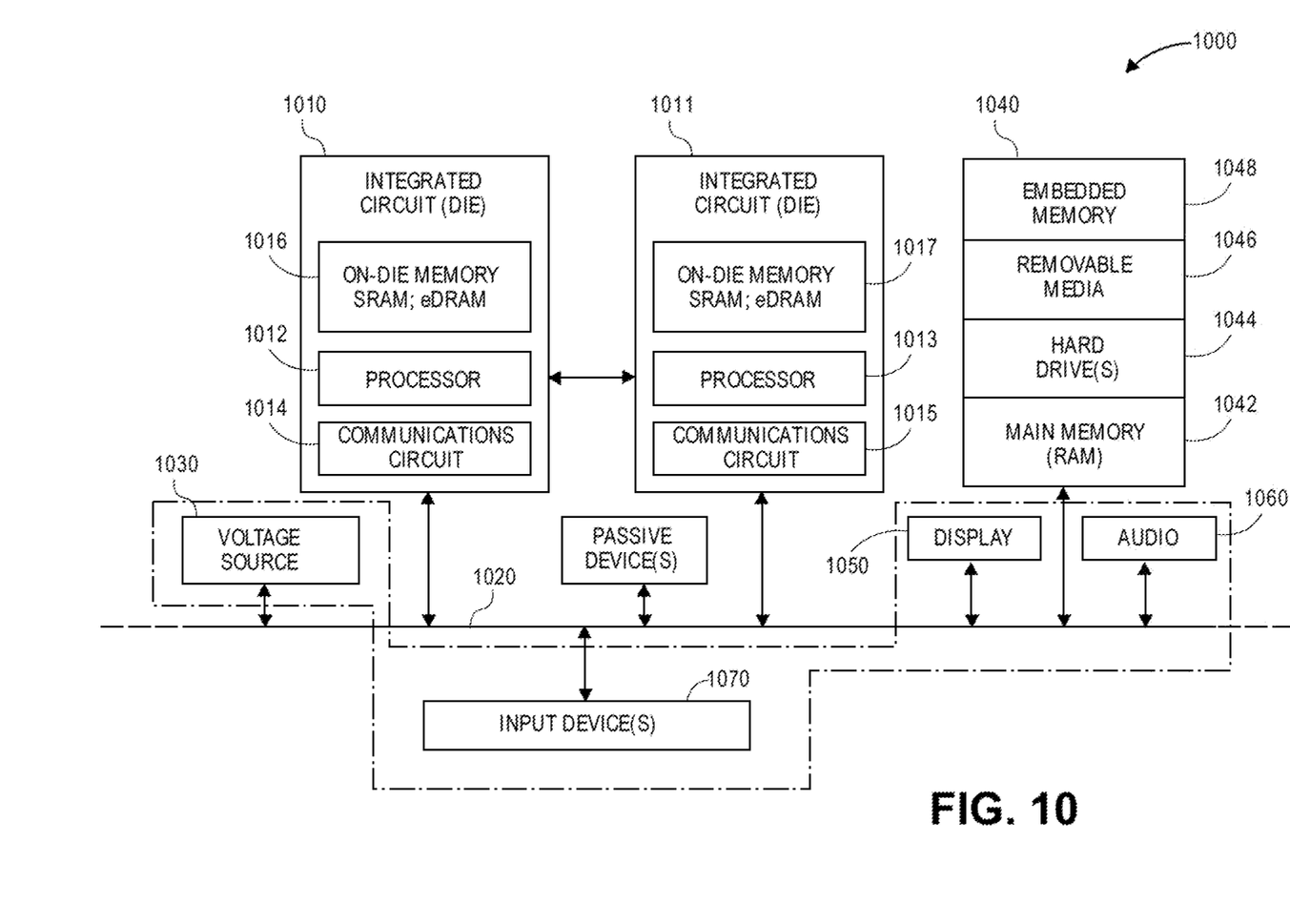
FIG. 10 schematically illustrates a computing device, in accordance with embodiments.

FIG. 10 schematically illustrates a computing device, in accordance with embodiments. The computer system 1000 (also referred to as the electronic system 1000) as depicted can embody a debug tool, according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a server system. The computer system 1000 may be a supercomputer or high-performance computing system.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 includes, or is coupled with, a debug tool, as disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1010 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in a die stack, according to an embodiment.

In an embodiment, the electronic system 1000 also includes a display device 1050, an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder.

As shown herein, the integrated circuit 1010 can be implemented in a number of different embodiments, including a debug tool module, according to any of the several disclosed embodiments and their equivalents, an electronic system, a computer system, one or more methods of fabricating an integrated circuit, and one or more methods of fabricating an electronic assembly that includes a debug tool module, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates and their equivalents. A foundation substrate may be included, as represented by the dashed line of FIG. 7. Passive devices may also be included, as is also depicted in FIG. 7.

EXAMPLES

The following paragraphs describe examples of various embodiments.

Example 1 is an apparatus to implement a debug tool, comprising: one or more computer processors; a data-receive module communicatively coupled to the one or more computer processors to receive a plurality of data captured, respectively, by a plurality of test instruments coupled to a device under test, wherein a plurality of data elements within, respectively, the plurality of captured data are associated with a timestamp based upon a time a data element was captured; an analysis module communicatively coupled to the one or more computer processors to analyze the received plurality of data captured, respectively, by the one or more test instruments; and a display module communicatively coupled to the one or more computer processors to display at least a portion of the analyzed plurality of captured data to a user.

Example 2 includes the apparatus of example 1, wherein the data-receive module is to receive at least a portion of the plurality of captured data from a central data collection database or from at least one of the plurality of test instruments.

Example 3 includes the apparatus of example 2, wherein the apparatus includes the central data collection database.

Example 4 includes the apparatus of example 1, wherein at least a portion of the plurality of data received from the plurality of test instruments is data streamed from at least one of the plurality of test instruments.

Example 5 includes the apparatus of example 4, wherein the data streamed from the at least one of the plurality of test instruments is isochronous.

Example 6 includes the apparatus of example 1, wherein at least a portion of the plurality of data is displayed in a sequence based upon the timestamp associated, respectively, with the plurality of data elements within the plurality of captured data.

Example 7 includes the apparatus of example 6, wherein the at least a portion of the plurality of data is displayed graphically and synchronized based on respective timestamps.

Example 8 includes the apparatus of any one of examples 1-7, further comprising: an input module communicatively coupled to the one or more computer processors to receive an indication of a test configuration from the user, wherein the test configuration is associated with configurations, respectively, of each of the one or more of the plurality of test instruments to identify attributes of data to be captured from the each of the one or more of the plurality of test instruments; wherein the analysis module is further to determine, based upon the received indication of the test configuration, one or more test instrument configuration commands to transmit, respectively, to the one or more of the plurality of test instruments based upon the indicated test configuration; and a transmission module community coupled with the one or more computer processors to transmit the determined one or more instrument configuration commands, respectively, to the one or more of the plurality of test instruments.

Example 9 includes the apparatus of example 8, wherein the test instrument configuration commands further includes data management commands.

Example 10 includes the apparatus of example 8, wherein the test instrument configuration commands further include commands to identify one or more events to cause the test instrument to trigger a high-resolution sample window.

Example 11 includes the apparatus of any one of examples 1-10, wherein the plurality of data captured includes indications of thermal data, voltage data, or current data associated with the device under test.

Example 12 is a system for debugging, comprising: an apparatus for debugging, including: one or more computer processors; a data-receive module communicatively coupled to the one or more computer processors to receive a plurality of data captured, respectively, by a plurality of test instruments coupled with a device under test, wherein a plurality of data elements within, respectively, the plurality of captured data are associated with a timestamp based upon a time a data element was captured; an analysis module communicatively coupled to the one or more computer processors to analyze the received plurality of data captured, respectively, by the one or more test instruments; and a display module communicatively coupled to the one or more computer processors to display at least a portion of the analyzed plurality of captured data to a user; and a plurality of test instruments communicatively coupled with the apparatus.

Example 13 includes the system of example 12, further comprising a display coupled with the apparatus.

Example 14 includes the system of example 12, further comprising a central data collection database communicatively coupled with the plurality of test instruments, wherein the central data collection database is to receive at least a portion of the plurality of data captured, respectively, by the plurality of test instruments; and wherein the data-receive module is to receive at least a portion of the plurality of data captured, respectively, by the plurality of test instruments from the central data collection database.

Example 15 includes the system of example 12, wherein the at least a portion of the plurality of data received from the plurality of test instruments is streamed from a portion of the plurality of test instruments.

Example 16 includes the system of example 12, wherein at least a portion of the plurality of data is displayed based upon the timestamp associated, respectively, with the plurality of data elements within the plurality of captured data.

Example 17 includes the system of example 12, wherein the at least a portion of the plurality of data is displayed graphically and synchronized based on timestamps.

Example 18 includes the system of any one of examples 12-17, wherein the apparatus further comprises: an input module communicatively coupled to the one or more computer processors to receive an indication of a test configuration from the user, wherein the test configuration is associated with configurations, respectively, of each of the one or more of the plurality of test instruments to identify attributes of data to be captured from the each of the one or more of the plurality of test instruments; wherein the analysis module is further to determine, based upon the received indication of the test configuration, one or more test instrument configuration commands to transmit, respectively, to the one or more of the plurality of test instruments based upon the indicated test configuration; and a transmission module community coupled with the one or more computer processors to transmit the determined one or more instrument configuration commands, respectively, to the one or more of the plurality of test instruments.

Example 19 includes the system of example 18, wherein the test instrument configuration commands further include commands to identify one or more events to cause the test instrument to increase a data sample rate.

Example 20 includes the system of example 18, wherein the test instrument configuration commands further includes commands to manage data storage within a test instrument.

Example 21 is one or more computer-readable media comprising instructions that cause a computing device for debugging, in response to execution of the instructions by the computing device, to: receive a plurality of data captured, respectively, by a plurality of test instruments coupled with a device under test, wherein a plurality of data elements within, respectively, the plurality of captured data are associated with a timestamp based upon a time a data element was captured; analyze the received plurality of data captured, respectively, by the one or more test instruments; and display at least a portion of the analyzed plurality of captured data to a user.

Example 22 includes the one or more computer-readable media of example 21, wherein to display at least a portion of the analyzed plurality of captured data further includes two display at least a portion of the analyzed plurality of captured data graphically and synchronized based on timestamps.

Example 23 includes the one or more computer-readable media of claim 21, wherein the instructions are further to: receive an indication of a test configuration from the user, wherein the test configuration is associated with configurations, respectively, of each of the one or more of the plurality of test instruments to identify attributes of data to be captured from the each of the one or more of the plurality of test instruments; determine, based upon the received indication of the test configuration, one or more test instrument configuration commands to transmit, respectively, to the one or more of the plurality of test instruments based upon the indicated test configuration; and transmit the determined one or more instrument configuration commands, respectively, to the one or more of the plurality of test instruments.

Example 24 includes the one or more computer readable media of example 23, wherein the test instrument configuration commands further include commands to identify one or more events to cause the test instrument to trigger a high-resolution sample window.

Example 25 includes the one or more computer readable media of example 21, wherein the plurality of data captured includes indications of thermal data, voltage data, or current data associated with the device under test.

Example 26 may include an apparatus comprising means to perform one or more elements of a method described in or related to any of examples 1-25, or any other method or process described herein.

Example 27 may include one or more non-transitory computer-readable media comprising instructions to cause an electronic device, upon execution of the instructions by one or more processors of the electronic device, to perform one or more elements of a method described in or related to any of examples 1-25, or any other method or process described herein.

Example 28 may include an apparatus comprising logic, modules, or circuitry to perform one or more elements of a method described in or related to any of examples 1-25, or any other method or process described herein.

Example 29 may include a method, technique, or process as described in or related to any of examples 1-25, or portions or parts thereof.

Example 30 may include an apparatus comprising: one or more processors and one or more computer-readable media comprising instructions that, when executed by the one or more processors, cause the one or more processors to perform the method, techniques, or process as described in or related to any of examples 1-25, or portions thereof.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An apparatus to implement a debug tool, comprising:
    one or more computer processors;
    a data-receive module communicatively coupled to the one or more computer processors to receive a plurality of data captured, respectively, by a plurality of test instruments coupled to a device under test, wherein a plurality of data elements within, respectively, the plurality of captured data are associated with a timestamp based upon a time a data element was captured;
    an analysis module communicatively coupled to the one or more computer processors to analyze the received plurality of data captured, respectively, by the plurality of test instruments;
    a display module communicatively coupled to the one or more computer processors to display at least a portion of the analyzed plurality of captured data to a user; and
    an input module communicatively coupled to the one or more computer processors to receive an indication of a test configuration from the user, wherein the test configuration is associated with configurations, respectively, of each of the one or more of the plurality of test instruments to identify attributes of data to be captured from the each of the one or more of the plurality of test instruments;
    wherein the analysis module is further to determine, based upon the received indication of the test configuration, one or more test instrument configuration commands to transmit, respectively, to the one or more of the plurality of test instruments based upon the indicated test configuration; and
    a transmission module community coupled with the one or more computer processors to transmit the determined one or more instrument configuration commands, respectively, to the one or more of the plurality of test instruments.

2. The apparatus of claim 1, wherein the data-receive module is to receive at least a portion of the plurality of captured data from a central data collection database or from at least one of the plurality of test instruments.

3. The apparatus of claim 2, wherein the apparatus includes the central data collection database.

4. The apparatus of claim 1, wherein at least a portion of the plurality of data received from the plurality of test instruments is data streamed from at least one of the plurality of test instruments.

5. The apparatus of claim 4, wherein the data streamed from the at least one of the plurality of test instruments is isochronous.

6. The apparatus of claim 1, wherein at least a portion of the plurality of data is displayed in a sequence based upon the timestamp associated, respectively, with the plurality of data elements within the plurality of captured data.

7. The apparatus of claim 6, wherein the at least a portion of the plurality of data is displayed graphically and synchronized based on respective timestamps.

8. The apparatus of claim 1, wherein the test instrument configuration commands further includes data management commands.

9. The apparatus of claim 1, wherein the test instrument configuration commands further include commands to identify one or more events to cause the test instrument to trigger a high-resolution sample window.

10. The apparatus of claim 1, wherein the plurality of data captured includes indications of thermal data, voltage data, or current data associated with the device under test.

11. A system for debugging, comprising:
    an apparatus for debugging, including:
        one or more computer processors;
        a data-receive module communicatively coupled to the one or more computer processors to receive a plurality of data captured, respectively, by a plurality of test instruments coupled with a device under test, wherein a plurality of data elements within, respectively, the plurality of captured data are associated with a timestamp based upon a time a data element was captured;
        an analysis module communicatively coupled to the one or more computer processors to analyze the received plurality of data captured, respectively, by the plurality of test instruments;
        a display module communicatively coupled to the one or more computer processors to display at least a portion of the analyzed plurality of captured data to a user; and
    the plurality of test instruments communicatively coupled with the apparatus; and
    an input module communicatively coupled to the one or more computer processors to receive an indication of a test configuration from the user, wherein the test configuration is associated with configurations, respectively, of each of the one or more of the plurality of test instruments to identify attributes of data to be captured from the each of the one or more of the plurality of test instruments;

wherein the analysis module is further to determine, based upon the received indication of the test configuration, one or more test instrument configuration commands to transmit, respectively, to the one or more of the plurality of test instruments based upon the indicated test configuration; and a transmission module community coupled with the one or more computer processors to transmit the determined one or more instrument configuration commands, respectively, to the one or more of the plurality of test instruments.

12. The system of claim 11, further comprising a display coupled with the apparatus.

13. The system of claim 11, further comprising a central data collection database communicatively coupled with the plurality of test instruments, wherein the central data collection database is to receive at least a portion of the plurality of data captured, respectively, by the plurality of test instruments; and wherein the data-receive module is to receive at least a portion of the plurality of data captured, respectively, by the plurality of test instruments from the central data collection database.

14. The system of claim 11, wherein the at least a portion of the plurality of data received from the plurality of test instruments is streamed from a portion of the plurality of test instruments.

15. The system of claim 11, wherein at least a portion of the plurality of data is displayed based upon the timestamp associated, respectively, with the plurality of data elements within the plurality of captured data.

16. The system of claim 11, wherein the at least a portion of the plurality of data is displayed graphically and synchronized based on timestamps.

17. The system of claim 11, wherein the test instrument configuration commands further include commands to identify one or more events to cause the test instrument to increase a data sample rate.

18. The system of claim 11, wherein the test instrument configuration commands further includes commands to manage data storage within a test instrument.

19. One or more computer-readable media comprising instructions that cause a computing device for debugging, in response to execution of the instructions by the computing device, to:

receive a plurality of data captured, respectively, by a plurality of test instruments coupled with a device under test, wherein a plurality of data elements within, respectively, the plurality of captured data are associated with a timestamp based upon a time a data element was captured;

analyze the received plurality of data captured, respectively, by the plurality of test instruments; and display at least a portion of the analyzed plurality of captured data to a user, wherein the instructions are further to:

receive an indication of a test configuration from the user, wherein the test configuration is associated with configurations, respectively, of each of the one or more of the plurality of test instruments to identify attributes of data to be captured from the each of the one or more of the plurality of test instruments;

determine, based upon the received indication of the test configuration, one or more test instrument configuration commands to transmit, respectively, to the one or more of the plurality of test instruments based upon the indicated test configuration; and transmit the determined one or more instrument configuration commands, respectively, to the one or more of the plurality of test instruments.

20. The one or more computer-readable media of claim 19, wherein to display at least a portion of the analyzed plurality of captured data further includes two display at least a portion of the analyzed plurality of captured data graphically and synchronized based on timestamps.

21. The one or more computer readable media of claim 19, wherein the test instrument configuration commands further include commands to identify one or more events to cause the test instrument to trigger a high-resolution sample window.

22. The one or more computer readable media of claim 19, wherein the plurality of data captured includes indications of thermal data, voltage data, or current data associated with the device under test.

* * * * *